United States Patent [19]
Banerji et al.

[11] Patent Number: 5,262,674
[45] Date of Patent: Nov. 16, 1993

[54] CHIP CARRIER FOR AN INTEGRATED CIRCUIT ASSEMBLY

[75] Inventors: Kingshuk Banerji, Plantation; Kenneth R. Thompson, Sunrise; Francisco d. Alves, Boca Raton, all of Fla.

[73] Assignee: Motorola, Inc., Schaumburg, Ill.

[21] Appl. No.: 866,951

[22] Filed: Apr. 9, 1992

Related U.S. Application Data

[63] Continuation of Ser. No. 650,351, Feb. 4, 1991, abandoned.

[51] Int. Cl.⁵ .................... H01L 23/02; H01L 39/02
[52] U.S. Cl. .................... 257/712; 257/729; 257/783
[58] Field of Search .............. 357/80, 81, 74, 73; 257/796, 720, 711, 712, 783, 729

[56] References Cited

U.S. PATENT DOCUMENTS

| | | | |
|---|---|---|---|
| 4,767,049 | 8/1988 | Butt et al. | 228/111 |
| 4,769,345 | 9/1988 | Butt et al. | 437/217 |
| 4,823,234 | 4/1989 | Konishi et al. | 357/72 |
| 4,937,653 | 6/1990 | Blonder et al. | 357/68 |
| 4,970,579 | 11/1990 | Arldt et al. | 357/81 |

FOREIGN PATENT DOCUMENTS

| | | | |
|---|---|---|---|
| 0206771 | 12/1986 | European Pat. Off. | 357/81 |
| 52-38885 | 3/1977 | Japan | 357/81 |
| 54-172850 | 7/1981 | Japan | 357/81 |
| 1-307253 | 12/1989 | Japan | 357/81 |

*Primary Examiner*—Andrew J. James
*Assistant Examiner*—D. Monin
*Attorney, Agent, or Firm*—Robert S. Babayi

[57] ABSTRACT

Epoxy bonding between an IC chip and a chip carrier is strengthened by creating substantially rougher oxidized surfaces within substantially smooth gold surfaces of a die paddle portion of the chip carrier.

7 Claims, 1 Drawing Sheet

CHIP CARRIER FOR AN INTEGRATED CIRCUIT ASSEMBLY

This is a continuation of application Ser. No. 07/650,351, filed Feb. 4, 1991, and now abandoned.

TECHNICAL FIELD

This invention relates generally to the field of integrated circuits and in particular to attaching a die chip to a chip carrier.

BACKGROUND

With the increasing size of large scale integrated circuit chips, the number of input and output connections that have to be made to a die chip has correspondingly increased. This trend has encouraged the evolution from dual in-line chip packages, which have two parallel rows of connection pins, to smaller and more dense leadless chip packages. In this arrangement, a die chip as carried by a leadless chip carrier is surface mounted onto a generally larger printed circuit (PC) board or other ceramic substrates. The chip carrier is surface mounted by placing it on top of corresponding PC board contact pads which mirror those contact pads of the chip carrier. An electrical and mechanical connection is then made by soldering the chip carrier to this generally larger board by reflow soldering. This arrangement is less cumbersome than mounting dual in-line packages onto a board and allows greater density of input and output connections. Leadless chip carriers generally consist of a package containing a substrate of ceramic which forms a or base onto which an IC chip is mounted. A conductive chip paddle portion is formed on the ceramic base of the chip carrier upon which the IC chip is placed. The chip paddle portion in addition to providing electrical ground path also provides a thermal conduction path for the IC chip. External contact pads formed around the four sides of the ceramic substrate are wire bonded to IC chip pads which are positioned on the top side of the IC chip. During wire bonding process, very thin wires may manually or automatically be placed between the chip pads and the external contacts to provide the electrical connections.

Conventionally, conductive patterns which form the chip paddle portion and the external contacts of the chip carrier have very smooth gold surfaces. The gold surfaces are formed by disposing a gold layer on a nickel layer which is disposed on top of a copper layer formed on the ceramic base of the chip carrier. The chip carrier is attached to the IC chip by depositing a layer of conductive or non-conductive bonding epoxy between the smooth gold surface of the chip paddle portion and the bottom side of the IC chip. However, the smooth gold surface of the die paddle does not provide a strong bonding surface for the bonding epoxy. Generally, smooth gold surface provide a poor adhesion between the bonding epoxy and the die paddle which may cause the IC chip to be detached from the chip carrier due to thermal excursions caused by soldering.

SUMMARY OF THE INVENTION

Accordingly, it is an object of the present invention to provide a chip carrier having an appropriate bonding surface for attaching an integrated circuit chip to the chip carrier.

Briefly, according to the invention, a chip carrier comprises a substrate which includes a conductive die paddle portion. The conductive die paddle portion is formed by disposing at least one conductive layer on the substrate. The die paddle portion includes at least one smooth gold surface and at least one substantially rougher surface which may be formed by oxidizing a portion of the conductive layer. The rougher surfaces allow a better adhesion between the die paddle portion and the integrated circuit chip.

DETAILED DESCRIPTION OF THE PREFERRED EMBODIMENT

Figure 1:
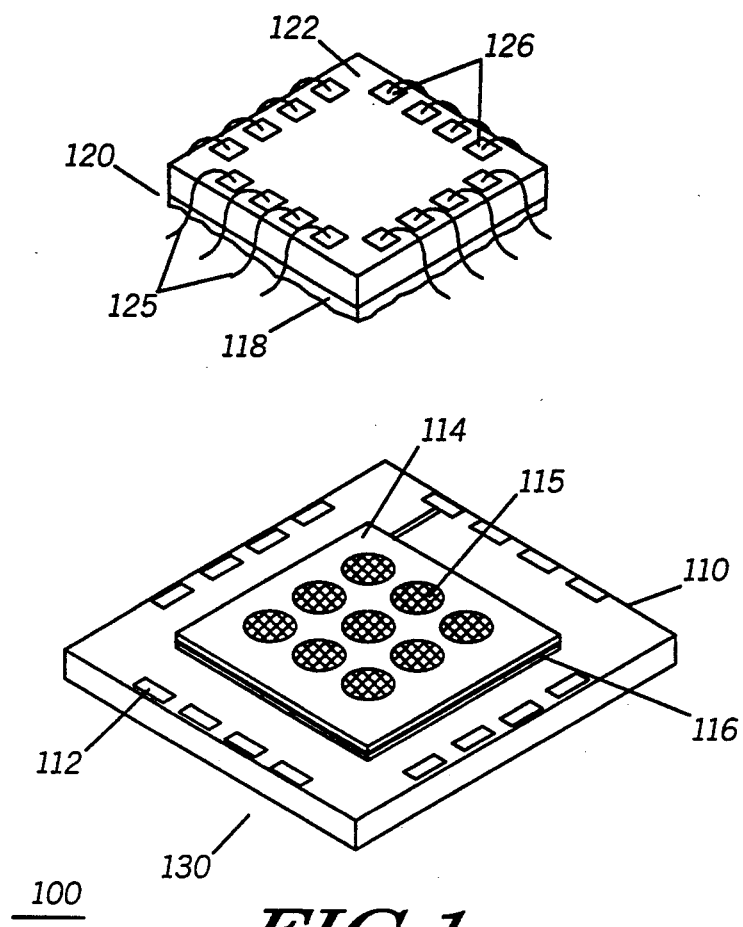
FIG. 1, is an exploded view of the circuit assembly according to the present invention.

Referring to FIG. 1, an exploded view of the integrated circuit assembly 100 of the present invention comprises an integrated circuit chip 120 which is carried by a chip carrier 130. The chip carrier 130 includes a substrate 110 made of any suitable ceramic or organic material, (e.g. polyimide or FR-4). It may be appreciated that the substrate 110 may also be a portion of a circuit board which may include other circuitry and/or components. Disposed on the substrate 110 are chip carrier contacts 112 which comprise the connection terminal between the circuits on the substrate 110 and integrated circuitry formed on the IC chip 120. The IC chip 120 may comprise any suitable integrated circuit, such as those manufactured by Motorola, Inc. The IC chip 120 has a major top surface 122 which includes a pad arrangement 126 which provide the input and/or the output terminals of the integrated circuit. In the preferred embodiment of the invention the pads 126 comprise gold contacts formed utilizing well-known techniques. The IC chip pads 126 and the chip carrier contacts 112 are electrically interconnected via by placing wire bonds 125 therebetween. The wire bonds 125 are placed utilizing well known manual or automatic wire bonding processes. The IC chip 120 is placed on a conductive die paddle portion 116 formed on the substrate 110 and is securely bonded thereto by means of a layer of conductive die attach 118 which may be made of any suitable material. As is well known in the art, the conductive die paddle portion 116 is coupled to at least one of the contact pad 122 to provide an electrical ground surface for the IC chip 120 when it is placed on the conductive die paddle portion 116. The conductive die attach 118 provides a secure bonding between the IC chip 120 and the substrate 110. In the preferred embodiment of the invention the die attach 118 comprise silver filled epoxy which provide a conductive bond between the IC chip 120 and the die paddle portion 116.

According to the invention, the conductive die paddle portion 116 is formed by disposing one or more layers of conductive material on the substrate 110. The conductive paddle 116's top surface is substantially smooth gold surface 114 and a plurality of substantially rougher surfaces 115. As will be described later in detail, the substantially rougher surfaces 115 are formed on the conductive die paddle portion 116 by selectively oxidizing a lower non-gold conductive layer. The bonding between the IC chip 120 and the chip carrier 130 is improved due to increased adhesion of the layer of die attach 118 to the substantially rougher surfaces 115.

Figure 2:
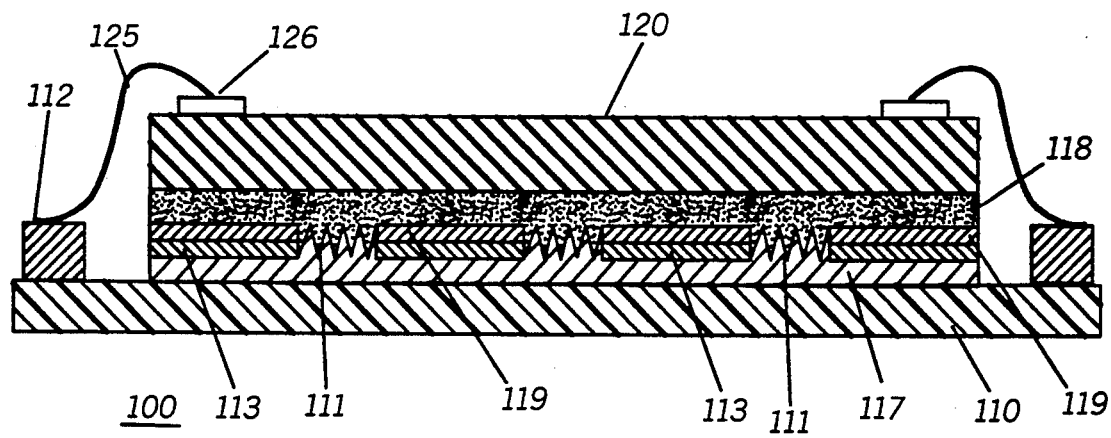
FIG. 2, is a cross sectional view of the circuit assembly according to the present invention.

Referring to FIG. 2, the cross-sectional view of the integrated circuit assembly 100 shows that preferably the die paddle portion 116 is formed on the substrate 110 by disposing a layer of copper 117 and a layer of nickel 113 under a top layer of gold 119 which provides the substantially smooth gold surface 114 of FIG. 1. Portions of the gold layer 119 and nickel layer 113 are selectively removed to expose the underlying copper layer 117. The removal of the gold and nickel layers may be achieved by well known masking and etching operations. A suitable oxide type treatment known in the art, such as black oxide, applied to exposed copper regions to create long columnar crystals 111 of copper oxide on the surface of the copper layer 113. The crystals 111 form the substantially rougher surfaces 115 of FIG. 1. It may be appreciated that the substantially rougher surfaces 115 may be formed by creating one or more oxides of copper.

Accordingly, the conductive die paddle portion 116 retains optimum electrical and thermal conductivity through the lower copper layer 117, even though the rougher oxidized surfaces 115 may not be conductive. The smooth surface 116 and the substantially rougher surfaces 115 of the die paddle portion 116 provide a far better adhesion quality to the die attach layer 118 than that which may be provided by a smooth gold surface alone. Therefore, a strong bond between the IC chip 120 and the chip carrier 130 is created.

What is claimed is:

1. A chip carrier for an integrated circuit chip, comprising:
   a substrate having a conductive layer disposed on one major side, said conductive layer having a surface for mounting said integrated circuit chip thereon, wherein said surface includes at least one substantially smooth surface and at least one selectively created rougher surface, said rougher surfaces being made of an oxide of the material of the conductive layer.

2. The chip carrier of claim 1, wherein said smooth surface comprises a gold surface.

3. The integrated circuit assembly of claim 1, wherein said conductive layer includes a layer of copper, wherein said smooth surface comprise a copper surface and said rougher surfaces comprise oxides of copper.

4. The integrated circuit of claim 3, wherein said conductive layer further includes a layer of nickel disposed on the smooth copper surface.

5. The integrated circuit of claim 4, wherein said conductive layer includes a layer of gold disposed on the layer of nickel.

6. An integrated circuit assembly, comprising:
   an integrated circuit chip;
   a chip carrier including:
      a substrate having a conductive layer disposed on one major side, said conductive layer having a surface for mounting said integrated circuit chip thereon, wherein said surface includes at least one substantially smooth surface and at least one selectively created rougher surface, said rougher surface being made of an oxide of the material of the conductive layer.

7. The integrated circuit assembly of claim 6, wherein said smooth surface comprises a gold surface.

* * * * *